United States Patent [19]

Spak et al.

[11] Patent Number: 4,931,381

[45] Date of Patent: Jun. 5, 1990

[54] IMAGE REVERSAL NEGATIVE WORKING O-QUINONE DIAZIDE AND CROSS-LINKING COMPOUND CONTAINING PHOTORESIST PROCESS WITH THERMAL CURING TREATMENT

[75] Inventors: Mark A. Spak, Edison; Donald Mammato, Lebanon; Dana Durham, Bloomsbury; Sangya Jain, Somerville, all of N.J.

[73] Assignee: Hoechst Celanese Corporation, Somerville, N.J.

[21] Appl. No.: 268,640

[22] Filed: Nov. 8, 1988

Related U.S. Application Data

[63] Continuation of Ser. No. 889,032, Jul. 23, 1986, abandoned, which is a continuation-in-part of Ser. No. 764,700, Aug. 12, 1985, abandoned.

[51] Int. Cl.$^5$ .................................................. G03F 7/26
[52] U.S. Cl. ........................................ 430/325; 430/165; 430/191; 430/192; 430/328; 430/330; 430/296; 430/942; 430/967
[58] Field of Search ............... 430/325, 326, 328, 330, 430/296

[56] References Cited

U.S. PATENT DOCUMENTS

| | | | |
|---|---|---|---|
| 3,264,104 | 8/1966 | Reichel | 430/325 |
| 3,640,992 | 2/1972 | Sus et al. | 260/141 |
| 3,869,292 | 3/1975 | Peters | 430/192 |
| 4,104,070 | 8/1978 | Moritz et al. | 430/325 |
| 4,196,003 | 4/1980 | Watanabe | 430/325 |
| 4,247,616 | 1/1981 | Vikesland et al. | 430/192 |
| 4,259,430 | 3/1981 | Kaplan et al. | 430/330 |
| 4,387,152 | 6/1983 | Stahlhofen | 430/191 |
| 4,404,272 | 9/1983 | Stahlhofer | 430/330 |
| 4,438,189 | 3/1984 | Geissler et al. | 430/280 |
| 4,439,516 | 3/1984 | Cornigliano et al. | 430/330 |
| 4,499,171 | 2/1985 | Hosaka et al. | 430/192 |
| 4,576,901 | 3/1986 | Stahlhofer et al. | 430/325 |
| 4,581,321 | 4/1986 | Stahlhofer | 430/325 |
| 4,600,683 | 7/1986 | Greco et al. | 430/325 |
| 4,642,282 | 2/1987 | Stahlhofer | 430/330 |
| 4,650,743 | 3/1987 | Galloway | 430/271 |

FOREIGN PATENT DOCUMENTS

| | | | |
|---|---|---|---|
| 164248 | 12/1985 | European Pat. Off. | 430/192 |
| 0202458 | 11/1986 | European Pat. Off. | |
| 1494640 | 12/1977 | United Kingdom | 430/325 |
| 2082339 | 3/1982 | United Kingdom | |

OTHER PUBLICATIONS

MacDonald, S. A., "Image Reversal: The Production of Negative Image in a Positive Photoresist", 1982, *IBM*, pp. 114–117.

Levine, H. A., "Positive Resist Speed Enhancing", *IBM Tech. Disclosure Bulletin*, vol. 13, No. 4, Sep. 1970.

Patent Abstracts of Japan, vol. 5, No. 96, p. 67, 6/23/81.

Pedersen, Structural Composition of Polymers Relative to Their Plasma Etch Characteristics, Deep U.V. Lithography, vol. 129, No. 1, p. 205, 1/1982.

*Primary Examiner*—Charles L. Bowers, Jr.
*Attorney, Agent, or Firm*—Plottel & Roberts

[57] ABSTRACT

A process for converting a normally positive working photosensitive composition to a negative working composition. One forms a composition containing an alkali soluble resin, a 1,2 quinone diazide-4-sulfonyl compound and an acid catalyzed crosslinker in a solvent mixture. After drying and imagewise exposing, the composition is baked and developed to produce a negative image.

16 Claims, No Drawings

IMAGE REVERSAL NEGATIVE WORKING O-QUINONE DIAZIDE AND CROSS-LINKING COMPOUND CONTAINING PHOTORESIST PROCESS WITH THERMAL CURING TREATMENT

This is a continuation of co-pending application Ser. No. 889,032, filed on Jul. 23, 1986, now abandoned, which is a continuation-in-part of Ser. No. 764,700, filed Aug. 12, 1985, now abandoned.

BACKGROUND OF THE INVENTION

The present invention relates generally to radiation sensitive photoresist compositions and particularly to compositions containing aqueous alkali soluble resins together with naphthoquinone diazide sensitizing agents.

It is well known in the art to produce positive photoresist formulations such as those described in U.S. Pat. Nos. 3,666,473, 4,115,128 and 4,173,470. These include alkalisoluble phenol-formaldehyde novolak resins together with light-sensitive materials, usually a substituted naphthoquinone diazide compound. The resins and sensitizers are dissolved in an organic solvent or mixture of solvents and are applied as a thin film or coating to a substrate suitable for the particular application desired.

The resin component of these photoresist formulations is soluble in aqueous alkaline solutions, but the naphthoquinone sensitizer acts as a dissolution rate inhibitor with respect to the resin. Upon exposure of selected areas of the coated substrate to actinic radiation, however, the sensitizer undergoes a radiation induced structural transformation and the exposed areas of the coating are rendered more soluble than the unexposed areas. This difference in solubility rates causes the exposed areas of the photoresist coating to be dissolved when the substrate is immersed in an alkaline developing solution while the unexposed areas are largely unaffected, thus producing a positive relief pattern on the substrate.

In most instances, the exposed and developed substrate will be subjected to treatment by a substrate-etchant solution. The photoresist coating protects the coated areas of the substrate from the etchant and thus the etchant is only able to etch the uncoated areas of the substrate, which in the case of a positive photoresist, correspond to the areas that were exposed to actinic radiation. Thus, an etched pattern can be created on the substrate which corresponds to the pattern on the mask, stencil, template, etc., that was used to create selective exposure patterns on the coated substrate prior to development.

The relief pattern of the photoresist on the substrate produced by the method described above is useful for various applications including as an exposure mask or a pattern such as is employed in the manufacture of miniaturized integrated electronic components.

The properties of a photoresist composition, which are important in commercial practice include the photospeed of the resist, development contrast, resist resolution, and resist adhesion.

Resist resolution refers to the capacity of a resist system to reproduce the smallest equally spaced line pairs and intervening spaces of a mask which is utilized during exposure with a high degree of image edge acuity in the developed exposed spaces.

In many industrial applications, particularly in the manufacture of minaturized electronic components, a photoresist is required to provide a high degree of resolution for very small line and space widths (on the order of one micron or less).

The ability of a resist to reproduce very small dimension, on the order of a micron or less, is extremely important in the production of large scale integrated circuits on silicon chips and similar components. Circuit density on such a chip can only be increased, assuming photolithography techniques are utilized, by increasing the resolution capabilities of the resist.

Photoresists are generally categorized as being either positive working or negative working. In a negative working resist composition, the imagewise light struck areas harden and form the image areas of the resist after removal of the unexposed areas with a developer. In a positive working resist the exposed areas are the non-image areas. The light struck parts are rendered soluble in aqueous alkali developers. While negative resists are the most widely used for industrial production of printed circuit boards, positive resists are capable of much finer resolution and smaller imaging geometries. Hence positive resists are the choice for the manufacture of densely packed integrated circuits.

In many commercial applications, it is desirable to convert a high resolution quinone diazide type positive resist for a negative working application.

There is interest in the field of image reversal because of the utility of this process in practical device manufacturing. Among the practical aspects of image reversal are the elimination of the need for a duel set of complementary masks to do both positive and negative imaging, greater resolution and process latitude than with positive imaging alone, reduction in standing wave effects, and higher thermal stability. In this regard, several methods have been suggested for such image reversal. See for example: *"Image Reversal: The Production of a Negative Image in a Positive Photoresist"* by S. A. MacDonald et.al. p. 114, IBM Research Disclosure, 1982; *"Image Reversal of Positive Photoresist"*. "A New Tool for Advancing Integrated Circuit Fabrication" by E. Alling et.al., Journal of the Society of Photo-Imaging Engineers, Vol. 539, p. 194, 1985; M. V. Buzuev et.al. *"Producing a Negative Image on a Positive Photoresist"* SU 1,109,708; German Patent DE 252 9054, C2, 1975, Assigned to H. Moritz and G. Paal, *Making a Negative Image*; and U.S. Pat. No. 4,104,070.

Each of these disclosures suffer from several drawbacks. A major disadvantage of current image reversal processes is the need for an additional processing step which involves treatment with either salt forming compounds or high energy exposure sources such as electron beams. The present invention provides a mechanism which involves the formation of a catalytic amount of a photogenerated acid which cross links the resin in the exposed region.

The invention provides a unique chemical composition, which when processed in a slightly modified manner to the usual and customary method of lithographic processing, yields a totally unexpected negative, reversed tone image from an otherwise expected positive type photosensitizer.

Among the advantages realized by this highly desirable result are improvement in the relationship between exposure energy and resulting line width, improved process latitude, improvement in developed image resolution, substantial elimination of reflective notching, enhanced photosensitivity, improved thermal stability of the resulting image, and improved adhesion between the photoresist and commonly used substrates.

SUMMARY OF THE INVENTION

The invention provides a process for preparing a negative working photographic element which comprises in order:

(a) forming a composition which comprises
  (i) from about 1% to about 25% based on the weight of the solid parts of the composition of a photosensitive compound having the formula

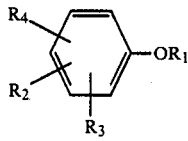

wherein
$R_1 = 1,2$ benzoquinone-2-diazide-4-sulfonyl; 1,2 naphthoquinone-2-diazide-4-sulfonyl; or 1,2 anthroquinone-2-diazide-4-sulfonyl
$R_2 = H, R_7, OR_6$ or

$R_3 = H, R_7, OR_6$ or

$R_4 = H, R_7, OR_6$ or

$R_6 = H$, alkyl, aryl, aralky or $R_1$
  $R_7 = $ alkyl, aryl or aralkyl
(ii) from about 75% to about 99% based on the weight of the solid parts of the composition of a novolak and/or polyvinyl phenol resin; and
(iii) from about 0.5% to about 20% based on the weight of the solid parts of the composition of a crosslinking compound which, when in the presence of that amount and strength of the acid generated when said diazide is exposed to actinic radiation, is capable of crosslinking said resin under the application of the heating conditions of step (e), said crosslinking compound has the formula $$(R_1O-CHR_3)_n-A-(CHR_4-OR_2)_m$$

wherein A has the formula B or B-Y-B, wherein B is a substituted or unsubstituted mononuclear or fused polynuclear aromatic hydrocarbon or a oxygen or sulfur containing heterocyclic compound, Y is a single bone, $C_1-C_4$-alkylene or -alkylenedioxy, the chains of which may be interrupted by oxygen atoms, $-O-$, $-S-$, $-SO_2-$, $-CO-$, $CO_2$, $-O-CO_2-$, $-CONH-$ or phenylenedioxy, $R_1$ and $R_2$ are H, $C_1-C_6$-alkyl, cycloalkyl, substituted or unsubstituted aryl, alkaryl or acyl; $R_3$, $R_4$ are independently H, $C_1-C_4$-alkyl or substituted or unsubstituted phenyl and n ranges from 1 to 3 and m ranges from 0–3, provided that $n+m$ is greater than 1; and '(iv) sufficient solvent to dissolve the foregoing composition components; and (b) coating said composition on a suitable substrate; and
(c) heating said coated substrate at a temperature of from about 20° C. to about 100° C. until substantially all of said solvent is dried off; and
(d) imagewise exposing said composition to actinic, electron beam, ion beam or x-ray radiation; and
(e) heating said coated substrate at a temperature of at least about 95° C. to about 160° C. for from about 10 seconds or more to crosslink said resin;
(f) removing the unexposed non-image areas of said composition with a suitable developer wherein the process is conducted in the absence of a flood exposure after heating step (e).

The invention also provides a composition which comprises (i) from about 1% to about 25% based on the weight of the solid parts of the composition of a photosensitive compound having the formula

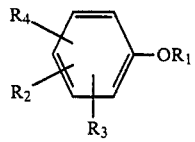

wherein
$R_1 = 1,2$ benzoquinone-2-diazide-4-sulfonyl; 1,2 naphthoquinone-2-diazide-4-sulfonyl; or 1,2 anthroquinone-2-diazide-4-sulfonyl
$R_2 = H, R_7, OR_6$ or

$R_3 = H, R_7, OR_6$ or

$R_4 = H, R_7, OR_6$ or

$R_6 = H$, alkyl, aryl, aralky or $R_1$
  $R_7 = $ alkyl, aryl or aralkyl
(ii) from about 75% to about 99% based on the weight of the solid parts of the composition of a novolak and/or polyvinyl phenol resin; and
(iii) from about 0.5% to about 20% based on the weight of the solid parts of the composition of a crosslinking compound which, when in the presence of that amount and strength of the acid generated when said diazide is exposed to actinic radiation, is capable of crosslinking said resin under the application of heat, said crosslinking compound has the formula $(R_1O-CHR_3)_n-A-(CHR_4-OR_2)_m$ wherein A has the formula B or B-Y-B, wherein B is a substituted or unsubstituted mononuclear or fused polynuclear aromatic hydrocarbon or a oxygen or sulfur containing heterocyclic compound, Y is a single bond, $C_1-C_4$-alkylene or -alkylenedioxy, the chains of which may be interrupted by oxygen atoms, —O—, —S—, —$SO_2$—, —CO—, $CO_2$, —O—$CO_2$—, —CONH— or phenylenedioxy, $R_1$ and $R_2$ are H, $C_1-C_6$-alkyl, cycloalkyl, substituted or unsubstituted aryl, alkaryl or acyl; $R_3$, $R_4$ are independently H, $C_1-C_4$-alkyl or substituted or unsubstituted phenyl and n ranges from 1 to 3 and m ranges from 0-3, provided that n+m is greater than 1; and (iv) sufficient solvent to dissolve the foregoing components.

DETAILED DESCRIPTION OF THE PREFERRED EMBODIMENT

As a first step in the production of the photographic element of the present invention, one coats and dries the foregoing photosensitive composition on a suitable substrate. The composition contains a solvent, crosslinking agent, binding resin and a 1,2 quinone diazide-4-sulfonyl group containing photosensitizer. The binding resins include the classes known as the novolaks, polyvinyl phenols and paravinyl phenols.

The production of novolak resins, which may be used for preparing photosensitive compositions, is well known in the art. A procedure for their manufacture is described in *Chemistry and Application of Phenolic Resins*, Knop A. and Scheib, W.; Springer Verlag, New York, 1979 in Chapter 4 which is incorporated herein by reference. Polyvinyl phenols and paravinyl phenols are taught in U.S. Pat. Nos. 3,869,292 and 4,439,516, which are incorporated herein by reference. Similarly, the use of o-quinone diazides is well known to the skilled artisan as demonstrated by *Light Sensitive Systems*, Kosar, J.; John Wiley & Sons, New York, 1965 in Chapter 7.4 which is also incorporated herein by reference. These sensitizers which comprise a component of the present resist compositions of the present invention are preferably selected from the group of substituted naphthoquinone diazide sensitizers which are conventionally used in the art in positive photoresist formulations. Such sensitizing compounds are disclosed, for example, in U.S. Pat. Nos. 2,797,213; 3,106,465; 3,148,983; 3,130,047; 3,201,329; 3,785,825; and 3,802,885, which are incorporated herein by reference.

The photosensitizer is a 1,2 quinone diazide-4-sulfonic acid ester of a phenolic derivative. It presently appears that the number of fused rings is not important for this invention but the position of the sulfonyl group is important. That is, one may use benzoquinones, naphthoquinones or anthroquinones as long as the oxygen is in the 1 position, diazo is in the 2 position and the sulfonyl group is in the 4 position. Likewise the phenolic member to which it is attached does not appear to be important. For example it can be a cumylphenol derivative as taught in U.S. Pat. No. 3,640,992 or it can be a mono-, di-, or tri-hydroxyphenyl alkyl ketone or benzophenone as shown in U.S. Pat. No. 4,499,171. Both of these patents are incorporated herein by reference.

As a generalized formula, the quinone diazides of the present invention may be represented by:

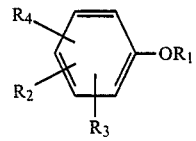

wherein $R_1$ = 1,2 benzoquinone-2-diazide-4-sulfonyl; 1,2 naphthoquinone-2-diazide-4-sulfonyl; or 1,2 anthroquinone-2-diazide-4-sulfonyl $R_2$ = H, $R_7$, $OR_6$ or $$\underset{C-R_7}{\overset{O}{\|}}$$

$R_3$ = H, $R_7$, $OR_6$ or $$\underset{C-R_7}{\overset{O}{\|}}$$

$R_4$ = H, $R_7$, $OR_6$ or $$\underset{C-R_7}{\overset{O}{\|}}$$

$R_6$ = H, alkyl, aryl, aralky or $R_1$
$R_7$ = alkyl, aryl or aralkyl

Useful photosensitizers include (1,2)naphthoquinonediazide-4-sulfonyl chloride, condensed with phenolic compounds such as hydroxy benzophenones especially trihydroxybenzophenone and more particularly 2,3,4-trihydroxybenzophenone; 2,3,4-trihydroxyphenyl pentyl ketone 1,2-naphthaquinone-2-diazide-4-sulfonic acid triester or other alkyl phenones; 2,3,4-trihydroxy-3'-methoxy benzophenone 1,2-naphthaquinone-2-diazide-4-sulfonic acid triester; 2,3,4-trihydroxy-3'-methyl benzophenone 1,2-naphthaquinone-2-diazide-4-sulfonic acid triester; and 2,3,4-trihydroxybenzophenone 1,2-naphthaquinone diazide-4-sulfonic acid triester.

The crosslinking compound is a compound, which when in the presence of that amount and strength of the acid generated when the diazide is exposed to actinic radiation, is capable of crosslinking the foregoing novolak, or polyvinyl phenol resin. This occurs upon the application of sufficient heat to diffuse the acid to the crosslinking component but less heat than will decompose the diazide. The general class of such compounds are those capable of forming a carbonium ion under the foregoing acid and heat conditions.

Crosslinkers suitable for use in the present invention have the general formula $(R_1O-CHR_3)_n-A-(CHR_4-OR_2)_m$ wherein A has the formula B or B-Y-B, wherein B is a substituted or unsubstituted mononuclear or fused polynuclear aromatic hydrocarbon or a oxygen or sulfur containing heterocyclic compound, Y is a single bond, $C_1-C_4$-alkylene or -alkylenedioxy, the chains of which may be interrupted by oxygen atoms, —O—, —S—, —$SO_2$—, —CO—, $CO_2$, —O—$CO_2$—, —CONH— or phenylenedioxy, $R_1$ and $R_2$ are H, $C_1-C_6$-alkyl, cycloalkyl, substituted or unsubstituted aryl, alkaryl or acyl; $R_3$, $R_4$ are independently, H, $C_1$-$C_4$-alkyl or substituted or unsubstituted phenyl and n ranges from 1 to 3 and m ranges from 0–3, provided that n+m is greater than 1.

In the preferred embodiment the crosslinking compound has the formula

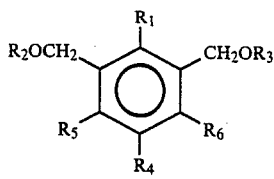

wherein $R_1$, $R_4$, $R_5$, $R_6$ are independently H, ($C_1$-$C_6$) alkyl, ($C_3$-$C_6$) cycloalkyl, aryl, arylalkyl or $OR_2$; and $R_2$, $R_3$ are independently H, ($C_1$-$C_6$) alkyl, ($C_3$-$C_6$) cycloalkyl, aryl or arylalkyl.

The preferred compounds are dimethylol paracresol as described in U.S. Pat. No. 4,404,272 which is incorporated by reference, and its ether and ester derivatives including benzene, 1-methoxy-2,6-bis(hydroxymethyl-4-methyl; phenol, 2,6-bis(methoxymethyl)-4-methyl; and benzene, 1-methoxy-2,6-bis(methoxymethyl)-4-methyl; methyl methoxy diphenyl ether, and epoxy cresol novolak resin.

The epoxy cresol novolak resins have the general formula

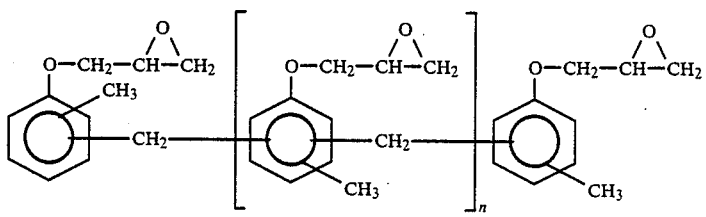

where n=1-10

The photosensitive composition is formed by blending the ingredients in a suitable solvent composition. In the preferred embodiment the resin is preferably present in the overall composition in an amount of from about 75% to about 99% based on the weight of the solid, i.e. non-solvent parts of the composition. A more preferred range of resin would be from about 80% to about 90% and most preferably from about 82% to about 85% by weight of the solid composition parts. The diazide is preferably present in an amount ranging from about 1% to about 25% based on the weight of the solid, i.e., non-solvent parts of the compositin. A more preferred range of the diazide would be from about 1% to about 20% and more preferably from about 10% to about 18% by weight of the solid composition parts. The crosslinker is preferably present in an amount ranging from about 0.5% to about 20% based on the weight of the solid, i.e. non-solvent parts of the composition. A more preferred range would be from about 1% to about 10% and most preferably from about 3% to about 6% by weight of the solid composition parts. In manufacturing the composition the resin, crosslinker and diazide are mixed with such solvents as the propylene glycol alkyl ether acetate, butyl acetate, xylene, ethylene glycol monoethyl ether acetate, and propylene glycol methyl ether acetate, among others.

Additives such as colorants, dyes, anti-striation agents, leveling agents, plasticizers, adhesion promoters, speed enhancers, solvents and such surfactants as non-ionic surfactants may be added to the solution of resin, sensitizer, cross-linker and solvent before the solution is coated onto a substrate.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) at one to ten percent weight levels, based on the combined weight of the solid parts of the composition. The dye additives help provide increased resolution by inhibiting back scattering of light off the substrate.

Anti-striation agents may be used up to five percent weight level, based on the combined weight of solids.

Plasticizers which may be used include, for example, phosphoric acid tri-($\beta$-chloroethyl)-ester; stearic acid; dicamphor; polypropylene; acetal resins; phenoxy resins; and alkyl resins at one to ten percent weight levels, based on the combined weight of solids. The plasticizer additives improve the coating properties of the material and enable the application of a film that is smooth and of uniform thickness to the substrate.

Adhesion promoters which may be used include, for example, $\beta$-(3,4-epoxy-cyclohexyl)-ethyltrimethoxysilane; p-methyldisilane-methyl methacrylate; vinyltrichlorosilane; and $\gamma$-amino-propyl triethoxysilane up to a 4 percent weight level, based on the combined weight of solids.

Speed enhancers that may be used include, for example, picric acid, nicotinic acid or nitrocinnamic acid at a weight level of up to 20 percent, based on the combined weight of resin and solids. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas.

The coating solvents may be present in the overall composition in an amount of up to 95% by weight of the solids in the composition.

Non-ionic surfactants that may be used include, for example, nonylphenoxy poly(ethyleneoxy) ethanol; octylphenoxy(ethyleneoxy) ethanol; and dinonyl phenoxy poly (ethyleneoxy) ethanol at up to 10 percent weight, based on the combined weight of solids.

The prepared resist solution can be applied to a substrate by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process. Suitable substrates include silicon, aluminum or polymeric resins, silicon dioxide, doped silicon dioxide, silicon nitride, tantalum, coper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters.

After the resist compositionn solution is coated onto the substrate, the substrate is temperature treated at approximately 20° to 100° C. This temperature treatment is selected in order to reduce and control the concentration of residual solvents in the photoresist while not causing substantial thermal degradation of the photosensitizer. In general one desires to minimize the concentration of solvents and thus this first temperature treatment is conducted until substantially all of the solvents have evaporated and a thin coating of photoresist composition, on the order of a micron in thickness, remains on the substrate. This treatment is normally conducted at temperatures in the range of from about 20° C. to about 100° C. In a preferred embodiment the temperature is conducted at from about 50° C. to about 90° C. A more preferred range is from about 70° C. to about 90° C. This treatment is conducted until the rate of change of solvent removal becomes relatively insignificant. The temperature and time selection depends on the resist properties desired by the user as well as equipment used and commercially desired coating times. Commercially acceptable treatment times for hot plate treatment are those up to about 3 minutes, more preferably up to about 1 minute. In one example, a 30 second treatment at 90° is useful. The coating substrate can then be exposed to actinic radiation, especially ultraviolet radiation, in any desired pattern, produced by use of suitable masks, negatives, stencils, templates, etc. in a manner well known to the skilled artisan. The resist is then subjected to a post exposure second baking or heat treatment of from about 95° C. to about 160° C., preferably 95° C. to 150° C., more preferably 112° C. to 120° C. This heating treatment may be conducted with a hot plate system for from about 10 seconds to the time necessary to crosslink the resin. This normally ranges from about 10 seconds to 90 seconds, more preferably from about 30 seconds to about 90 seconds and most preferably from 15 to 45 seconds. Durations for longer than 90 seconds are possible but do not generally provide any additional benefit. The time selected depends on the choice of composition components and the substrate used. Heating diffuses the generated acid to the crosslinking component. The baking treatment also converts the diazide to a carboxylic acid containing compound, for example indene carboxylic acid, which is soluble in aqueous alkali solutions.

The selection of the first and second heat treatment temperatures and first and second heat treatment times may be selected and optimized by the properties which are desired by the end user.

The exposed resist-coated substrates are next substantially immersed in a suitable developing solution. The solution is preferably agitated, for example, by nitrogen burst agitation. The substrates are allowed to remain in the developer until all, or substantially all, of the resist coating has dissolved from the exposed areas. Suitable developers include aqueous alkaline solutions such as those including sodium hydroxide, and tetramethyl ammonium hydroxide as are well known in the art.

After removal of the coated wafers from the developing solution, an optional post-development heat treatment or bake may be employed to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The resist compositions of the present invention are resistant to acid-base etching solutions and provide effective protection for the unexposed resist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

The following non-limiting examples serve to illustrate the invention:

EXAMPLE 1

The photoresist is made up of a solution containing, 5% of solids of dimethylol para cresol, 6% of solids of 2,3,4-trihydroxy-3'-methyl benzophenone 1,2-naphthaquinone-2-diazide-4-sulfonic acid triester and 89% of solids of cresol novolac resin in propylene glycol monomethyl ether acetate.

Using this formulation silicon wafers are coated at 4,000 rpm and then soft-baked in a vented convection oven at 90° C. for 30 minutes. Actinic exposure is applied using the Perkin Elmer 220 Micralign aligner through a glass photomask containing a resolution test pattern. Using aperature #4, the scan speeds are varied between 200 and 400 arbitrary energy units. These different scan speeds (each scan speed represents a different experiment) corresponds to between 20 and 10 $mJ/cm^2$ respectively as determined by an OAI radiometer for wavelengths between 365 and 436 nm. The photomask consists of a resolution test pattern where single line and equal line spaces are represented. The width of these features varies between 1.0 and 3.0 um in 0.25 um increments. After exposure the wafers are hard baked sequentially on a MTI Inc. hot plate at temperatures ranging from 110° C. to 150° C. for up to 60 seconds. A relief image is now observable when the wafers are placed under an optical microscope with monochromatic 520 nm illumination.

After developing the exposed and hard baked wafers in AZ 433 MIF Developer available from the AZ Photoresists Group of American Hoechst Corporation, Somerville, N.J. (a 0.33N solution of tetramethylammonium hydroxide) in an immersion mode process for 3 minutes with slight agitation, the wafers are DI water rinsed and spin dryed. If the wafers are now examined using a scanning electron microscope at 10,000 magnification, 1 μm single space and larger geometries are clearly seen to be completely opened.

EXAMPLE 2

The photoresist is made up of a solution containing, 5% of solids of dimethylol para cresol, 6% of solids of 2,3,4-trihydroxy-3'-methoxy benzophenone 1,2-naphthaquinone-2-diazide-4-sulfonic acid triester and 89% of solids of cresol novolac resin in propylene glycol monomethyl ether acetate.

Using this formulation silicon wafers are coated at 4,000 rpm and then soft-baked in a vented convection oven at 90° C. for 30 minutes. Actinic exposure is applied using the Perkin Elmer 220 Micralign aligner through a glass photomask containing a resolution test pattern. Using aperature #4, the scan speeds are varied between 200 and 400 arbitrary energy units. These different scan speeds (each scan speed represents a different experiment) corresponds to between 20 and 10 mJ/cm$^2$ respectively as determined by an OAI radiometer for wavelengths between 365 and 436 nm. The photomask consists of a resolution test pattern where single line and equal line and spaces are represented. The width of these features varies between 1.0 and 3.0 um in 0.25 um increments. After exposure the wafers are hard baked sequentially on a MTI Inc. hot plate at temperatures ranging from 110° C. to 150° C. for up to 60 seconds. A relief image is now observable when the wafers are placed under an optical microscope with monochromatic 520 nm illumination.

After developing the exposed and hard baked wafers in AZ 433 MIF Developer available from the AZ Photoresists Group of American Hoechst Corporation, Somerville, N.J. (a 0.33N solution of tetramethylammonium hydroxide) in an immersion mode process for 3 minutes with slight agitation, the wafers are DI water rinsed and spin dryed. If the wafers are now examined using a scanning electron microscope at 10,000 magnification, 1 um single space and larger geometries are clearly seen to be completely opened.

EXAMPLE 3

The photoresist is made up of a solution containing, 5% of solids of dimethylol para cresol, 6% of solids of 2,3,4-trihydroxy phenyl pentyl ketone-1,2-naphthaquinone-2-diazide-4-sulfonic acid triester and 89% of solids of cresol novolac resin in propylene glycol monomethyl ether acetate.

Using this formulation silicon wafers are coated at 4,000 rpm and then soft-baked in a vented convection oven at 90° C. for 30 minutes. Actinic exposure is applied using the Perkin Elmer 220 Micralign aligner through a glass photomask containing a resolution test pattern. Using aperature #4, the scan speeds are varied between 200 and 400 arbitrary energy units. These different scan speeds (each scan speed represents a different experiment) corresponds to between 20 and 10 mJ/cm$^2$ respectively as determined by an OAI radiometer for wavelengths between 365 and 436 nm. The photomask consists of a resolution test pattern where single line and equal line and spaces are represented. The width of these features varies between 1.0 and 3.0 μm in 0.25 μm increments. After exposure the wafers are hard baked sequentially on a MTI Inc. hot plate at temperatures ranging from 110° C. to 150° C. for up to 60 seconds. A relief image is now observable when the wafers are placed under an optical microscope with monochromatic 520 nm illumination.

After developing the exposed and hard baked wafers in AZ 433 MIF Developer available from the AZ Photoresists Group of American Hoechst Corporation, Somerville, N.J. (a 0.33N solution of tetramethylammonium hydroxide) in an immersion mode process for 3 minutes with slight agitation, the wafers are DI water rinsed and spin dryed. If the wafers are now examined using a scanning electron microscope at 10,000 magnification, 1 μm single space and larger geometries are clearly seen to be completely opened.

EXAMPLE 4

The photoresist is made up of a solution containing, 5% of solids of methyl methoxy diphenyl ether, 6% of solids of 2,3,4-trihydroxy benzophenone 1,2-naphthaquinone-2-diazide-4-sulfonic acid triester and 89% of solids of cresol novolac resin in propylene glycol monomethyl ether acetate.

Using this formulation silicon wafers are coated at 4,000 rpm and then soft-baked in a vented convection oven at 90° C. for 30 minutes. Actinic exposure is applied using the Perkin Elmer 220 Micralign aligner through a glass photomask containing a resolution test pattern. Using aperature #4, the scan speeds are varied between 200 and 400 arbitrary energy units. These different scan speeds (each scan speed represents a different experiment) corresponds to between 20 and 10 mJ/cm$^2$ respectively as determined by an OAI radiometer for wavelengths between 365 and 436 nm. The photomask consists of a resolution test pattern where single line and equal line and spaces are represented. The width of these features varies between 1.0 and 3.0 μm in 0.25 μm increments. After exposure the wafers are hard baked sequentially on a MTI Inc. hot plate at temperatures ranging from 110° C. to 150° C. for up to 60 seconds. A relief image is now observable when the wafers are placed under an optical microscope with monochromatic 520 nm illumination.

After developing the exposed and hard baked wafers in AZ 433 MIF Developer available from the AZ Photoresists Group of American Hoechst Corporation, Somerville, N.J. (a 0.33N solution of tetramethylammonium hydroxide) in an immersion mode process for 3 minutes with slight agitation, the wafers are DI water rinsed and spin dryed. If the wafers are now examined using a scanning electron microscope at 10,000 magnification, 1 μm single space and larger geometries are clearly seen to be completely opened.

EXAMPLE 5

The photoresist is made up of a solution containing, 5% of solids of methyl methoxy diphenyl ether, 6% of solids of 2,3,4-trihydroxy-3'-methyl benzophenone 1,2-naphthaquinone-2-diazide-4-sulfonic acid triester and 89% of solids of cresol novolac resin in propylene glycol monomethyl ether acetate.

Using this formulation silicon wafers are coated at 4,000 rpm and then soft-baked in a vented convection oven at 90° C. for 30 minutes. Actinic exposure is applied using the Perkin Elmer 220 Micralign aligner through a glass photomask containing a resolution test pattern. Using aperature #4, the scan speeds are varied between 200 and 400 arbitrary energy units. These different scan speeds (each scan speed represents a different experiment) corresponds to between 20 and 10 mJ/cm$^2$ respectively as determined by an OAI radiometer for wavelengths between 365 and 436 nm. The photomask consists of a resolution test pattern where single line and equal line and spaces are represented. The width of these features varies between 1.0 and 3.0 μm in 0.25 μm increments. After exposure the wafers are hard baked sequentially on a MTI Inc. hot plate at temperatures ranging from 110° C. to 150° C. for up to 60 seconds. A relief image is now observable when the wafers are placed under an optical microscope with monochromatic 520 nm illumination.

After developing the exposed and hard baked wafers in AZ 433 MIF Developer available from the AZ Photoresists Group of American Hoechst Corporation, Somerville, N.J. (a 0.33N solution of tetramethylammonium hydroxide) in an immersion mode process for 3 minutes with slight agitation, the wafers are DI water rinsed and spin dryed. If the wafers are now examined using a scanning electron microscope at 10,000 magnification, 1 μm single space and larger geometries are clearly seen to be completely opened.

EXAMPLE 6

The photoresist is made up of a solution containing, 5% of solids of methyl methoxy diphenyl ether, 6% of solids of 2,3,4-trihydroxy-3'-methoxy benzophenone 1,2-naphthaquinone-2-diazide-4-sulfonic acid triester and 89% of solids of cresol novolac resin in propylene glycol monomethyl ether acetate.

Using this formulation silicon wafers are coated at 4,000 rpm and then soft-baked in a vented convection oven at 90° C. for 30 minutes. Actinic exposure is applied using the Perkin Elmer 220 Micralign aligner through a glass photomask containing a resolution test pattern. Using aperature #4, the scan speeds are varied between 200 and 400 arbitrary energy units. These different scan speeds (each scan speed represents a different experiment) corresponds to between 20 and 10 mJ/cm$^2$ respectively as determined by an OAI radiometer for wavelengths between 365 and 436 nm. The photomask consists of a resolution test pattern where single line and equal line and spaces are represented. The width of these features varies between 1.0 and 3.0 μm in 0.25 μm increments. After exposure the wafers are hard baked sequentially on a MTI Inc. hot plate at temperatures ranging from 110° C. to 150° C. for up to 60 seconds. A relief image is now observable when the wafers are placed under an optical microscope with monochromatic 520 nm illumination.

After developing the exposed and hard baked wafers in AZ 433 MIF Developer available from the AZ Photoresists Group of American Hoechst Corporation, Somerville, N.J. (a 0.33N solution of tetramethylammonium hydroxide) in an immersion mode process for 3 minutes with slight agitation, the wafers are DI water rinsed and spin dryed. If the wafers are now examined using a scanning electron microscope at 10,000 magnification, 1 μm single space and larger geometries are clearly seen to be completely opened.

EXAMPLE 7

The photoresist is made up of a solution containing, 5% of solids of methyl methoxy diphenyl ether, 6% of solids of 2,3,4-trihydroxy phenyl pentyl ketone-1,2-naphthaquinone-2-diazide-4-sulfonic acid triester and 89% of solids of cresol novolac resin in propylene glycol monomethyl ether acetate.

Using this formulation silicon wafers are coated at 4,000 rpm and then soft-baked in a vented convection oven at 90° C. for 30 minutes. Actinic exposure is applied using the Perkin Elmer 220 Micralign aligner through a glass photomask containing a resolution test pattern. Using aperature #4, the scan speeds are varied between 200 and 400 arbitrary energy units. These different scan speeds (each scan speed represents a different experiment) corresponds to between 20 and 10 mJ/cm$^2$ respectively as determined by an OAI radiometer for wavelengths between 365 and 436 nm. The photomask consists of a resolution test pattern where single line and equal line and spaces are represented. The width of these features varies between 1.0 and 3.0 μm in 0.25 μm increments. After exposure the wafers are hard baked sequentially on a MTI Inc. hot plate at temperatures ranging from 110° C. to 150° C. for up to 60 seconds. A relief image is now observable when the wafers are placed under an optical microscope with monochromatic 520 nm illumination.

After developing the exposed and hard baked wafers in AZ 433 MIF Developer available from the AZ Photoresists Group of American Hoechst Corporation, Somerville, N.J. (a 0.33N solution of tetramethylammonium hydroxide) in an immersion mode process for 3 minutes with slight agitation, the wafers are DI water rinsed and spin dryed. If the wafers are now examined using a scanning electron microscope at 10,000 magnification, 1 μm single space and larger geometries are clearly seen to be completely opened.

EXAMPLE 8

The photoresist is made up of a solution containing, 5% of solids of epoxy cresol novolac resin, 6% of solids of 2,3,4-trihydroxy benzophenone 1,2-naphthaquinone-2-diazide-4-sulfonic acid triester and 89% of solids of cresol novolac resin in propylene glycol monomethyl ether acetate.

Using this formulation silicon wafers are coated at 4,000 rpm and then soft-baked in a vented convection oven at 90° C. for 30 minutes. Actinic exposure is applied using the Perkin Elmer 220 Micralign aligner through a glass photomask containing a resolution test pattern. Using aperature #4, the scan speeds are varied between 200 and 400 arbitrary energy units. These different scan speeds (each scan speed represents a different experiment) corresponds to between 20 and 10 mJ/cm$^2$ respectively as determined by an OAI radiometer for wavelengths between 365 and 436 nm. The photomask consists of a resolution test pattern where single line and equal line and spaces are represented. The width of these features varies between 1.0 and 3.0 μm in 0.25 μm increments. After exposure the wafers are hard baked sequentially on a MTI Inc. hot plate at temperatures ranging from 110° C. to 150° C. for up to 60 seconds. A relief image is now observable when the wafers are placed under an optical microscope with monochromatic 520 nm illumination.

After developing the exposed and hard baked wafers in AZ 433 MIF Developer available from the AZ Photoresists Group of American Hoechst Corporation, Somerville, N.J. (a 0.33N solution of tetramethylammonium hydroxide) in an immersion mode process for 3 minutes with slight agitation, the wafers are DI water rinsed and spin dryed. If the wafers are now examined using a scanning electron microscope at 10,000 magnification, 1 μm single space and larger geometries are clearly seen to be completely opened.

EXAMPLE 9

A photoresist is made of a solution containing, 5% of solids of the methylated phenol derivative of dimethlol para cresol, 6% of solids of 2,3,4-trihydroxy benzophenone 1,2-naphthaquinone-2-diazide-4-sulfonic acid triester and 89% of solids of cresol novolac resin in propylene glycol monomethyl ether acetate.

Using this formulation silicon wafers are coated at 4,000 rpm and then soft-baked in a vented convection oven at 90° C. for 30 minutes. Actinic exposure is applied using the Perkin Elmer 220 Micralign aligner through a glass photomask containing a resolution test pattern. Using aperature #4, the scan speeds are varied between 200 and 400 arbitrary energy units. These different scan speeds (each scan speed represents a different experiment) corresponds to between 20 and 10 mJ/cm² respectively as determined by an OAI radiometer for wavelengths between 365 and 436 nm. The photomask consists of a resolution test pattern where single line and equal line and spaces are represented. The width of these features varies between 1.0 and 3.0 μm in 0.25 μm increments. After exposure the wafers are hard baked sequentially on a MTI Inc. hot plate at temperatures ranging from 110° C. to 150° C. for up to 60 seconds. A relief image is now observable when the wafers are placed under an optical microscope with monochromatic 520 nm illumination.

After developing the exposed and hard baked wafers in AZ 433 MIF Developer available from the AZ Photoresists Group of American Hoechst Corporation, Somerville, N.J. (a 0.33N solution of tetramethylammonium hydroxide) in an immersion mode process for 3 minutes with slight agitation, the wafers are DI water rinsed and spin dryed. If the wafers are now examined using a scanning electron microscope at 10,000 magnification, 1 μm single space and larger geometries are clearly seen to be completely opened.

EXAMPLE 10

A photoresist is made of a solution containing, 5% of solids of dimethylol para cresol, 6% of solids of 2,3,4-trihydroxy benzophenone 1,2-naphthaquinone-2-diazide-4-sulfonic acid triester and 89% of solids of cresol novolac resin in propylene glycol monomethyl ether acetate.

Using this formulation silicon wafers are coated at 4,000 rpm and then soft-baked in a vented convection oven at 90° C. for 30 minutes. Exposure is applied via direct write electron beam using an exposure does of 55 μC. After exposure, a post exposure bake of 125° C. for 35 minutes in a convection oven followed.

After developing the exposed and post exposure baked wafers in AZ 440 MIF Developer available from the AZ Photoresists Group of American Hoechst Corporation, Somerville, N.J. (a 0.40N solution of tetramethylammonium hydroxide) in an immersion mode process for 4 minutes with slight agitation, the wafers are DI water rinsed and spin dryed. If the wafers are now examined using a scanning electron microscope at 10,000 magnification, 1 μm single space and larger geometries are clearly seen to be completely opened.

What is claimed is:

1. A process for preparing a negative working photographic element which consists essentially of in order:
   (a) forming a composition which consists essentially of in admixture
      (i) from about 1% to about 25% based on the weight the solid parts of the composition of a photosensitive compound having the formula

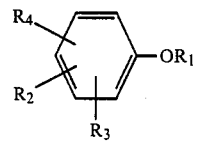

wherein
$R_1$ = 1,2 benzoquinone-2-diazide-4-sulfonyl; 1,2 naphthoquinone-2-diazide-4-sulfonyl; or 1,2 anthraquinone-2-diazide-4-sulfonyl
$R_2$ = H, $R_7$, $OR_6$ or

$R_3$ = H, $R_7$, $OR_6$ or

$R_4$ = H, $R_7$, $OR_6$ or

$R_6$ = H, alkyl, aryl, aralkyl or $R_1$
$R_7$ = alkyl, aryl or aralkyl (ii) from about 75% to about 99% based on the weight of the solid parts of the composition of a novolak resin; and (iii) from about 0.5% to about 20% based on the weight of the solid parts of the composition of a crosslinking compound which has the formula

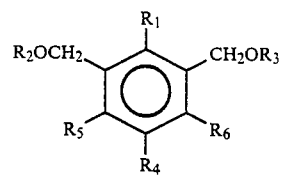

wherein $R_1$, $R_4$, $R_5$, $R_6$ are independently H, ($C_1$–$C_6$) alkyl, ($C_3$–$C_6$)cycloalkyl, aryl, arylalkyl or $OR_2$; and $R_2$, $R_3$ are independently H, ($C_1$–$C_6$) alkyl, ($C_3$–$C_6$) cycloalkyl, aryl or arylalkyl; and (iv) sufficient solvent to dissolve the foregoing composition components; and (b) coating said composition on a substrate; and (c) heating said coated substrate at a temperature of from about 20° to about 100° until substantially all of said solvent is dried off; and (d) imagewise exposing said composition to actinic, electron beam, ion beam or x-ray radiation; and (e) heating said coated substrate at a temperature of at least about 95° C. to about 160° for from about 10 seconds or more to crosslink said resin; and (f) removing the radiation unexposed non-image areas of said composition with a developer wherein the process is conducted in the absence of a flood exposure after heating step (e).

2. The process of claim 1 wherein said photosensitizer is 2,3,4-trihydroxybenzophenone-1,2-naphthoquinone-2-diazide-4-sulfonic acid triester.

3. The process of claim 1 wherein said crosslinker is dimethylol paracresol.

4. The process of claim 1 wherein said crosslinker is methyl methoxy diphenyl ether.

5. The process of claim 1 wherein said crosslinking compound is one or more compounds selected from the group consisting of benzene, 1-methoxy-2,6-bis(hydroxymethyl-4-methyl-; phenol, 2,6-bis(methoxymethyl)-4-methyl-; and benzene, 1-methoxy-2,6-bis(methoxymethyl)-4-methyl-.

6. The process of claim 1 wherein said solvent comprises propylene glycol alkyl ether acetate.

7. The process of claim 1 wherein said substrate is selected from the group consisting of silicon, aluminum or polymeric resins, silicon dioxide, doped silicon dioxide, silicon nitride, tantalum, copper, polysilicon, ceramics and aluminum/copper mixtures.

8. The process of claim 1 wherein said composition further comprises one or more compounds selected from the group consisting of colorants, dyes, anti-striation agents, leveling agents, plasticizers, adhesion promoters, speed enhancers, and surfactants.

9. The process of claim 1 wherein said step (e) is conducted at a temperature of from about 95° C. to about 150° C.

10. The process of claim 9 wherein said step (e) is conducted for from about 10 seconds to about 90 seconds.

11. The process of claim 1 wherein said step (e) is conducted at a temperature of from about 112° C. to about 120° C.

12. The process of claim 11 wherein said step (e) is conducted for from about 10 seconds to about 90 seconds.

13. The process of claim 1 wherein said developer is an aqueous alkaline solution.

14. The process of claim 13 wherein said developer comprises sodium hydroxide and/or tetramethyl ammonium hydroxide.

15. The process of claim 1 wherein said step (e) is conducted for from about 10 seconds to about 90 seconds.

16. The process of claim 1 wherein, said crosslinker comprises dimethylol paracresol, said heating step (e) is conducted at a temperature of from about 112° C. to about 120° C. for up to 90 seconds, and said developer comprises an aqueous solution of sodium hydroxide and/or tetramethyl ammonium hydroxide.

* * * * *